United States Patent [19]
DeBusk et al.

[11] Patent Number: 5,739,067
[45] Date of Patent: Apr. 14, 1998

[54] METHOD FOR FORMING ACTIVE DEVICES ON AND IN EXPOSED SURFACES OF BOTH SIDES OF A SILICON WAFER

[75] Inventors: Damon K. DeBusk, Austin; Bruce L. Pickelsimer, Pflugerville, both of Tex.

[73] Assignee: Advanced Micro Devices, Inc., Sunnyvale, Calif.

[21] Appl. No.: 568,992

[22] Filed: Dec. 7, 1995

[51] Int. Cl.$^6$ ............................................. H01L 21/283
[52] U.S. Cl. ........................... 438/618; 438/928; 257/773
[58] Field of Search ................................ 257/253, 621, 257/773, 777, 778; 437/51, 208, 226, 227, 915, 974; 438/928, 977, 138, 455, 459, 618, 49, 53

[56] References Cited

U.S. PATENT DOCUMENTS

| | | | |
|---|---|---|---|
| 3,577,037 | 5/1971 | DiPietro et al. | 437/208 |
| 3,592,705 | 7/1971 | Kawashima et al. | 437/226 |
| 3,648,131 | 3/1972 | Stuby | 257/778 |
| 3,706,129 | 12/1972 | McCann | 437/208 |
| 3,972,113 | 8/1976 | Nakata et al. | 437/227 |
| 4,051,507 | 9/1977 | Rosvold | 437/208 |
| 4,505,799 | 3/1985 | Baxter | 257/253 |
| 5,233,219 | 8/1993 | Shimoji et al. | 257/621 |
| 5,625,209 | 4/1997 | Appleton et al. | 257/253 |

OTHER PUBLICATIONS

S. Wolf & R.N. Tauber, "Silicon processing for the VLSI Era" vol. I, pp. 182–191, 280–283, 321–323, Jun. 1986.
S. Wolf, "Silicon processing for the VLSI Era" vol. II, pp. 229–231, Jun. 1990.

Primary Examiner—Charles L. Bowers, Jr.
Assistant Examiner—Leon Radomsky
Attorney, Agent, or Firm—Kevin L. Daffer; Conley, Rose & Tayon

[57] ABSTRACT

A method for the formation of active devices upon and within exposed surfaces of both sides of a silicon wafer is presented. A dual-sided silicon wafer is provided having a first surface and an opposed second surface prepared similarly to achieve surfaces suitable for fabricating semiconductor devices. The method advantageously integrates the ability to preform wafer processing operations on both exposed surfaces separately or simultaneously. Wafer processing operations are layering, patterning, doping, and heat treatment. The processing sequence is complete when a doped region and a patterened interconnect line electrically coupled thereto (i.e., minimal integrated circuits) are formed upon and within both surfaces of the dual-sided silicon wafer. A wafer handling system and processing station for dual-sided silicon wafers are described. In addition, a technique of applying a protective layer over one surface of a dual-sided silicon wafer is also described. Once a protective layer has been applied over one surface of a dual-sided silicon wafer, one or more wafer processing operations may be carried out upon the opposed surface using common wafer processing equipment without damaging the structures formed upon and within the surface covered with the protective layer. The protective layer may later be stripped away in order to gain access to the covered surface for further processing.

15 Claims, 5 Drawing Sheets

METHOD FOR FORMING ACTIVE DEVICES ON AND IN EXPOSED SURFACES OF BOTH SIDES OF A SILICON WAFER

BACKGROUND OF THE INVENTION

1. Field of the Invention

This invention relates to the manufacture of integrated circuits and more particularly to a method for forming electronic devices upon and within the exposed surfaces of both sides of a silicon wafer.

2. Description of the Relevant Art

An integrated circuit consists of electronic devices electrically coupled by conductive trace elements, often called interconnect lines. Electronic devices typically include one or more doped regions. Interconnect lines (i.e., interconnects) are patterned from conductive layers formed on or above the surface of a silicon substrate. One or more conductive layers may be patterned to form one or more levels of interconnects spaced from each other by one or more interlevel dielectric structures.

Integrated circuits are typically manufactured using a series of silicon wafer fabrication operations. Silicon wafer fabrication operations form an integrated circuit upon and within an exposed surface of one side a silicon wafer. As defined herein, the four basic wafer fabrication operations are layering, patterning, doping, and heat treatments.

Layering is a process used to add a thin layer of an insulating, semiconducting, or conducting material to an exposed surface of one or both sides of a silicon wafer. Common layering techniques include thermal oxidation, chemical vapor deposition (CVD), evaporation, and sputtering.

Patterning is a series of steps resulting in the removal of selected portions of one or more layers formed on an exposed surface of one or both sides of a silicon wafer. Such removal may be performed to create islands of a layer material, or to create holes through a layer for access to one or more underlying layers or to the wafer itself. The common patterning process is often referred to as photomasking, masking, photolithography, or microlithography. In a typical patterning process, a desired pattern is first transferred to a layer of photoresist material formed on an exposed surface of one side (i.e., a frontside surface) of the silicon wafer. Select portions of the photoresist layer are removed in areas where etching removal of one or more layers formed on the frontside surface is desired. Photoresist material thus remains only over areas in which etching removal is not desired. An etching step then removes material from areas not protected by overlying photoresist material. Following the etching step, the remaining photoresist material is removed.

Doping is a process of placing dopants upon and within an exposed surface of one or both sides of a silicon wafer. The two common doping methods are thermal diffusion and ion implantation. Thermal diffusion is a chemical process during which exposed areas of a silicon wafer are subjected to dopant ions produced when a substance containing dopant atoms is heated. Ion implantation is a physical process during which dopant atoms are ionized, accelerated to high speeds, and "shot" into an exposed surface of one side of a silicon wafer. Doping produces the p-n junctions required for semiconductor operation.

Heat treatments are operations during which a silicon wafer is heated and cooled to achieve specific results. During heat treatments, material is not typically added or removed from the silicon wafer. Important heat treatments include drive-in operations after thermal diffusion, annealing operations after ion implantation, and the alloying of portions of a patterned metal layer with specific regions of the surface of a silicon wafer to form low resistance electrical connections.

A silicon wafer has two opposed and substantially planar sides. Due to the fact that current silicon wafer fabrication processes concentrate on an exposed surface of only one side of a silicon wafer (i.e., a frontside surface), the exposed surfaces of the two substantially planar sides are often referred to as a frontside surface and a backside surface. Active devices are formed upon and within specially-prepared frontside surfaces. After a single crystal ingot has been grown, a complex sequence of shaping and polishing steps are performed in order to produce a silicon wafer with a frontside surface suitable for fabricating semiconductor devices. A sawing operation produces slices, called wafers, from a shaped ingot. A lapping and grinding process is next employed to increase surface flatness and bring all wafers within a specified thickness tolerance. A chemical-mechanical polishing step is then typically used to produce a frontside surface which is scratch and damage free.

The backside surface of a silicon wafer is often prepared in a manner much different from that of the frontside surface. The backside surface is typically subjected to mechanical damage by abrasion, grooving, or sandblasting during wafer manufacture in order to enhance the use of the frontside surface for fabricating semiconductor devices. The resulting crystal damage at the backside surface causes the growth of dislocations which radiate up into the wafer. These dislocations trap mobile contaminants at sites away from the frontside surface where active devices are to be formed. Alternately, such extrinsic gettering sites which sink mobile impurities may be formed by diffusing phosphorous into the backside surface of a silicon wafer and/or depositing a layer of polycrystalline silicon (polysilicon) on the backside surface. At the end of the wafer fabrication process, the backside surface of a silicon wafer is typically thinned by grinding. After thinning, a layer of gold is often applied to the backside surface in order to form a low resistance electrical connection to the substrate bulk.

It would be desirable to have a method for forming active devices upon and within exposed surfaces of both sides of a silicon wafer. Such a method would allow the number of active devices which can be placed on a single die (or chip) to be increased substantially without reducing the dimensions of active device elements. Only a small additional starting material cost would be expected (if any) to cover the additional cost of preparing the backside surface in the same manner as the frontside surface. The resulting silicon wafer will be referred to as a dual-sided silicon wafer. (Since the exposed surfaces of the two sides of the silicon wafer are now indistinguishable, the frontside surface and backside surface terminology will hereinafter not be used). Further, the doped wells in which active devices may be formed on the exposed surface of one side of a silicon wafer may serve as extrinsic gettering sites for active devices formed upon and within the exposed surface of the opposed side. Thus the benefit of extrinsic gettering would not be lose with such a method.

SUMMARY OF THE INVENTION

The problems outlined above are in large part solved by a method for the formation of active devices upon and within exposed surfaces of both sides of a silicon wafer. A dual-sided silicon wafer is provided having a first surface and an opposed second surface prepared similarly to achieve surfaces suitable for fabricating semiconductor devices. The method advantageously integrates the ability to perform wafer processing operations on both exposed surfaces separately or simultaneously. Wafer processing operations are selected from the group consisting of layering, patterning, doping, and heat treatment. The processing sequence is complete when a doped region and a patterned interconnect line electrically coupled thereto (i.e., minimal integrated circuits) are formed upon and within both the first and second surfaces of the dual-sided silicon wafer.

A wafer handling system and processing station for dual-sided silicon wafers are described. In addition, a technique of applying a protective layer over one surface of a dual-sided silicon wafer is also described. Once a protective layer has been applied over one surface of a dual-sided silicon wafer, one or more wafer processing operations may be carried out upon the opposed surface using common wafer processing equipment without damaging the structures formed upon and within the surface covered with the protective layer. The protective layer may later be stripped away in order to gain access to the covered surface for further processing. The protective layer is applied at temperatures below which dopant ions within the doped regions migrate or redistribute therefrom. A suitable protective layer comprises silicon dioxide (oxide) or silicon nitride deposited using a low temperature process. Alternately, the protective layer may comprise a layer of a cured spin-on glass material.

BRIEF DESCRIPTION OF THE DRAWINGS

Other objects and advantages of the invention will become apparent upon reading the following detailed description and upon reference to the accompanying drawings in which.

Figure 1:
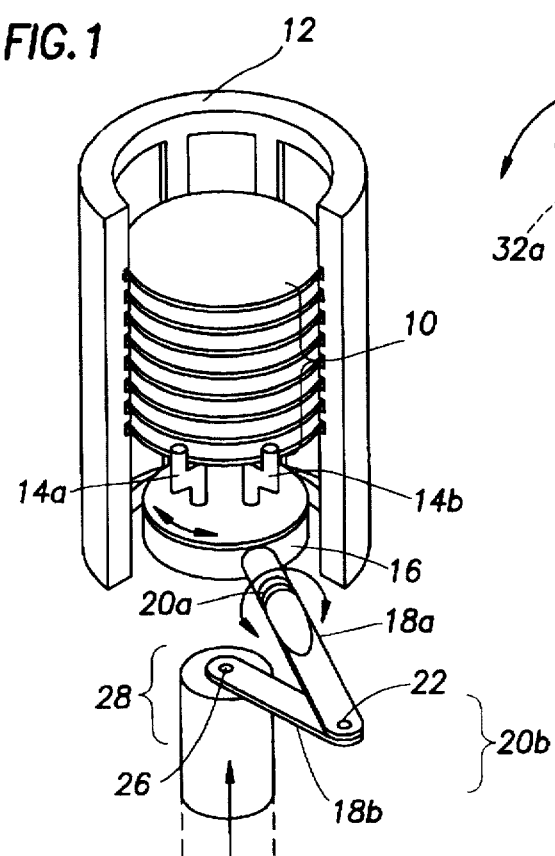
FIG. 1 is an isometric view of a mechanical hand of a wafer transfer system grasping the bottom silicon wafer of a vertical stack of several silicon wafers in a wafer carrier.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The first requirement to allow the formation of active devices upon and within exposed surfaces of both sides of a silicon wafer is to provide a dual-sided silicon wafer. As defined herein, a dual-sided silicon wafer is a silicon wafer in which the exposed surfaces of both sides are prepared similarly to achieve exposed surfaces suitable for fabricating semiconductor devices. After a lapping and grinding process, a chemical-mechanical polishing operation may be performed to the exposed surfaces of both sides of a dual-sided silicon wafer to produce exposed surfaces which are scratch and damage free.

Special wafer handling and processing equipment may be used to allow processing on both sides of a silicon wafer. FIGS. 1–7 illustrate wafer handling and processing equipment capable of forming integrated circuits upon and within exposed surfaces of both sides of a silicon wafer. FIG. 1 is an isometric view of several silicon wafers 10 stacked vertically in a wafer carrier 12, the bottom silicon wafer being gripped by moveable fingers 14a and 14b of a mechanical hand 16. (Two additional moveable fingers 14c and 14d are hidden by silicon wafers 10). Mechanical hand 16 is mounted at the end of an articulated mechanical arm 18.

Articulated mechanical arm 18 is made up of a first arm section 18a, a second arm section 18b, a rotational joint 20a in first arm section 18a, and a translational joint 20b where first arm section 18a and second arm section 18b are joined by an arm pin 22. Rotational arm joint 20a allows first section 18a to rotate about an axis parallel to a center line through the length of first arm section 18a. Translational arm joint 20b allows first arm section 18a to move about arm pin 22 in a plane parallel to the plane of second arm section 18b.

Wafer holder 12 is positioned on a flat working surface (e.g., a table). Articulated mechanical arm 18 is joined to a vertical positioner 24 by a positioner pin 26. Vertical positioner 24 is able to move vertically through a hole in the working surface, allowing vertical positioning of mechanical arm 18 with respect to wafer holder 12. A translational positioner joint 28 is formed where second arm section 18b and vertical positioner 24 are joined by positioner pin 26. Translational positioner joint 28 allows second arm section 18b to move about positioner pin 26 in a plane parallel to a planar upper surface of vertical positioner 24. By virtue of the joints described above, positioning of mechanical hand 16 is very flexible within limits determined by the lengths of first arm section 18a, second arm section 18b, and vertical positioner 24.

Figure 2:
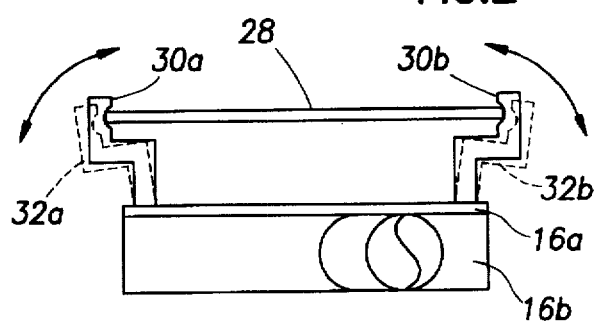
FIG. 2 is a side view of the mechanical hand illustrating how a silicon wafer may be gripped by extending and retracting the moveable fingers of the mechanical hand.
Figure 3:
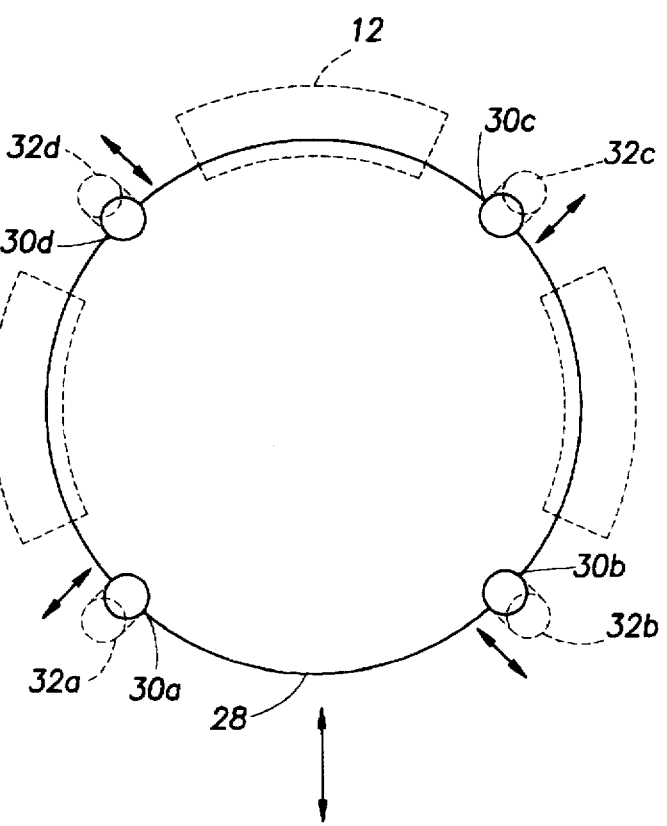
FIG. 3 is a top (i.e., plan) view of the operation of the mechanical hand in FIG. 2 illustrating how a silicon wafer may be gripped by extending and retracting the moveable fingers of the mechanical hand.

FIGS. 2 and 3 illustrate how a silicon wafer 28 may be gripped by extending and retracting moveable fingers 14a–d of mechanical hand 16. FIG. 2 is a side view of mechanical hand 16 gripping silicon wafer 28, and FIG. 3 is a plan view of mechanical hand 16 gripping silicon wafer 28. In retracted positions 30a–d, moveable fingers 14a–d (respectively) contact an area of silicon wafer 28 near an outer edge, holding silicon wafer 28 in place between indentations in upper portions of moveable fingers 14a–d. In extended positions 32a–d, moveable fingers 14a–d (respectively) no longer contact the outer edge of silicon wafer 28. Thus silicon wafer 28 is no longer held in place between moveable fingers 14a–d. By extending and retracting moveable fingers 14a–d of mechanical hand 16, silicon wafer 28 may be safely inserted into or removed from wafer carrier 12.

FIGS. 1 and 2 also show how an upper plate 16a of mechanical hand 16 is able to rotate about an axis normal to and passing through the centers of the substantially planar surfaces of upper plate 16a. Lower section 16b of mechanical hand 16 remains firmly attached to first arm section 18a of mechanical arm 18. Moveable fingers 14a–d are attached to upper plate 16a, and thus rotate with upper plate 16a. This rotating action permits positioning of moveable fingers 14a–d for wafer transfer operations, and also permits the use of mechanical hand 16 to hold silicon wafer 28 during various liquid spin-coat operations.

Figure 4:
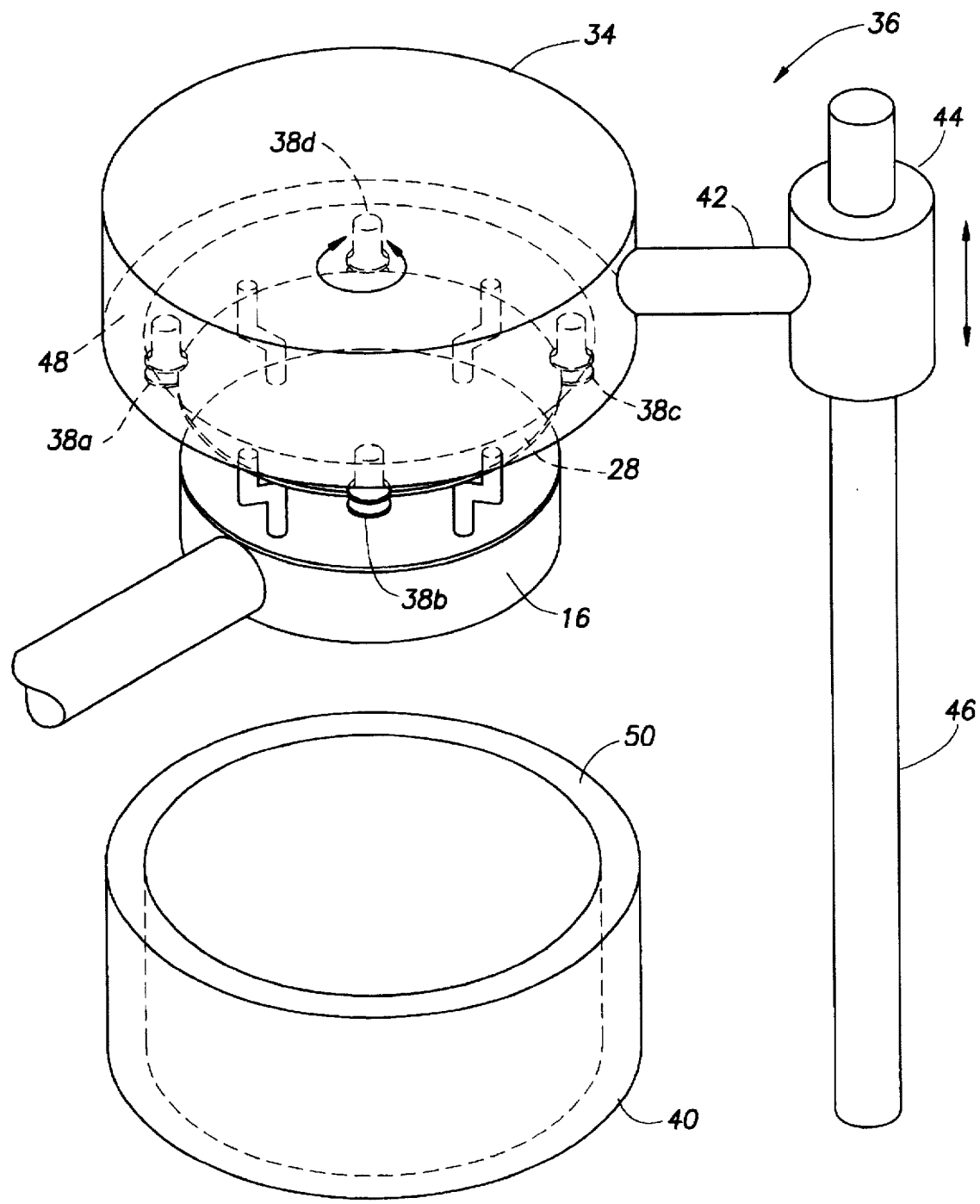
FIG. 4 is an isometric view of a silicon wafer being transferred from the mechanical hand to a wafer clamp device within an upper section of a wafer processing station.

FIGS. 4–7 illustrate how the wafer transfer system of FIG. 1 may be combined with modern wafer processing stations to form a system capable of performing many basic wafer fabrication operations. FIG. 4 is an isometric view of silicon wafer 28 being transferred from mechanical hand 16 to a wafer clamp device within an upper section 34 of a wafer processing station 36. The wafer clamp device includes four holding terminals 38a–d. Holding terminals 38a–d may be extended and retracted much like moveable fingers 14a–d of mechanical hand 16. When holding terminals 38a–d are retracted (as shown in FIG. 4), concave portions of each holding terminal contact an area of silicon wafer 28 near an outer edge, holding silicon wafer 28 in place between the holding terminals. When holding terminals 38a–d are extended, the concave portions of each holding terminal no longer contact the outer edge of silicon wafer 28. Thus silicon wafer 28 is no longer held in place between the holding terminals. By extending and retracting holding terminals 38a–d of the wafer clamp device, silicon wafer 28 may be transferred to or from the wafer clamp device of the upper section 34 of the wafer processing station.

As shown in FIG. 4, holding terminals 38a–d are also able to rotate about an axis through their centers lengthwise. When a silicon wafer is held between the four holding terminals 38a–d and the holding terminals are caused to rotate in the same direction and at the same speed, the silicon wafer also rotates about an axis normal to and passing through the centers of its planar surfaces. Such rotation of silicon wafer 28 may be employed during wafer processing operations to achieve a desired result (e.g., increased uniformity during deposition or etching operations).

Wafer processing station 36 includes upper section 34, lower section 40, connecting arm 42, moving member 44, and vertical pole 46. Lower section 40 and one end of vertical pole 46 are attached to a flat working surface (e.g., a table). Upper section 34 is attached to moving member 44 by connecting arm 42. Moving member 44 is mounted on vertical pole 46, and is adapted to move up and down along vertical pole 44. Lower section 40 and vertical pole 46 are spaced such that a mating surface 48 of upper section 34 mates with a mating surface 50 of lower section 50 when moving member 44 reaches the end of its travel near the end of vertical pole 46 attached to the working surface. (See FIG. 5a).

Figure 5A:
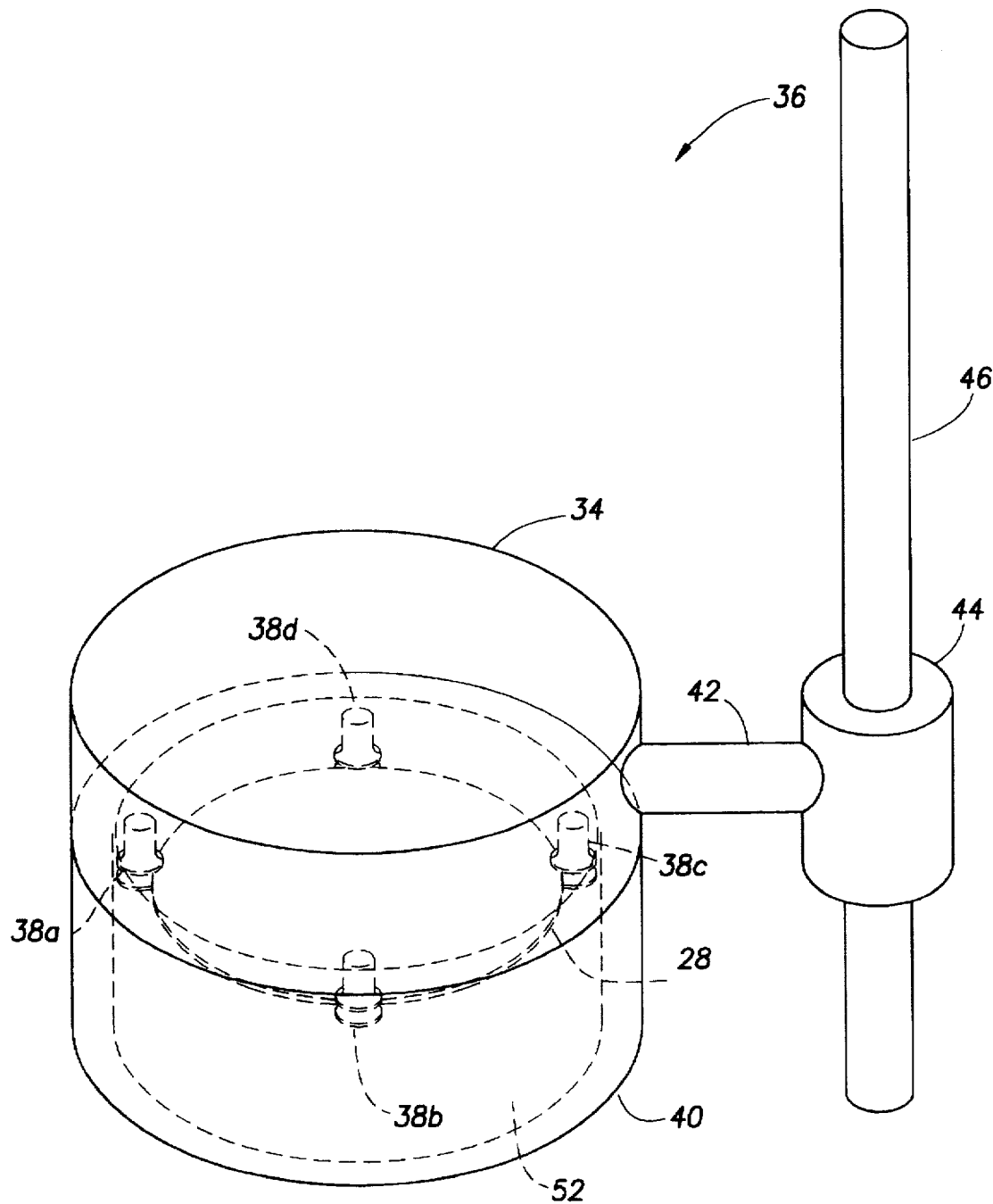
FIG. 5a is an isometric view of a silicon wafer, held in the wafer clamp device, being subjected to a wafer fabrication operation carried out within a processing chamber formed by the joining of an upper section and a lower section of a wafer processing station.

FIG. 5a is an isometric view of silicon wafer 28, held in position by the four holding terminals 38a–d of the wafer clamp device, being subjected to a wafer processing operation carried out within a processing chamber 52 formed by the mating of the upper section 34 and the lower section 40 of wafer processing station 36. Types of wafer fabrication operations which may be conducted within processing chamber 52 include layering, patterning, and heat treatments.

Layering operations which may be conducted within processing chamber 52 include thermal layer growth (e.g., silicon dioxide and silicon nitride) and layer deposition (e.g., chemical vapor deposition of silicon dioxide and silicon nitride). Patterning operations which may be conducted within processing chamber 52 include etching operations (e.g., wet spray etching and plasma etching). Wafer processing stations capable of performing layering and patterning operations on the exposed surfaces of both sides of a silicon wafer independently are described hereinbelow. One wafer processing system including a processing station is the Equinox processing system manufactured by Semitool Inc., Kalispell, Mont.

FIGS. 1–7 illustrate the capabilities of a wafer handling and processing systems which allow for processing of dual-sided silicon wafers. Alternately, one or both exposed surfaces of a silicon wafer may be coated with a protective layer to prevent damage to circuit structures during wafer handling or during wafer processing. For example, the wafer handling system of the Equinox system may include a robotic arm with a spatula-like appendage for transporting wafers. Prior to operation of such a wafer handling system, a silicon wafer to be moved is positioned with both major surfaces parallel to a horizontal plane. The spatula-like appendage is then slid under a bottom surface of a silicon wafer, the appendage and supported silicon wafer are raised up and repositioned to the destination, and the appendage is lowered and removed from under the bottom surface of the silicon wafer. In order to prevent mechanical damage to structures formed upon and within the bottom surface of the silicon wafer during such handling, the bottom surface of the silicon wafer may be coated with a protective layer prior to transport. The protective layer may later be stripped away in order to gain access to the bottom surface of the silicon wafer for further processing.

A suitable protective layer must be applied at temperatures below which dopant ions within the doped regions migrate or redistribute therefrom. In addition, it is desirable to keep processing temperatures low in order to minimize the migration of impurities (i.e., contaminants) within the silicon wafer. Examples of suitable protective layers include oxide and silicon nitride layers deposited using well-known low temperature chemical vapor deposition (CVD) techniques. A protective oxide layer may be formed over one or both exposed surfaces of a silicon wafer by placing the silicon wafer in a reaction chamber containing silane ($SiH_4$) and oxygen ($O_2$), and increasing the temperature within the reaction chamber. A low temperature oxide ($SiO_2$) layer may thus be formed through the following reaction:

$$SiH_4 + O_2 \rightarrow SiO_2 + 2H_2$$

Alternately, the protective layer may comprise a layer of a cured spin-on glass (SOG) material. During a typical SOG application, a layer of a liquid SOG material is first applied over one surface of a silicon wafer using a spin-coat process. The SOG layer is then cured by heating the silicon wafer in an oven. A typical SOG curing process includes two heating steps. A first heating step is carried out at a relatively low temperature (e.g., 150°–250° C. for 1–15 minutes in air) to drive the solvent out of the SOG layer. A second heating step is then performed at a higher temperature (e.g., 400°–425° C. for 30–60 minutes in air) to drive out water formed during polymerization of the SOG material. The remaining solid SOG film exhibits dielectric properties similar to those of oxide.

Protective oxide layers must be carefully removed after wafer handling or processing as not to damage structures formed upon and within both surfaces of the silicon wafer. A suitable removal procedure includes a dry or wet etch process. Such processes may be carried out in the wafer processing station of FIGS. 5a–b. A wet etch process for removing oxide may be carried out in the wafer processing station of FIGS. 5a–b using a hydrofluoric acid (HF) etchant. The HF may be passed over an exposed surface of the silicon wafer in droplet or vapor form. A subsequent deionized water rinse may be used to remove unreacted HF and residue from the etching process.

Figure 5B:
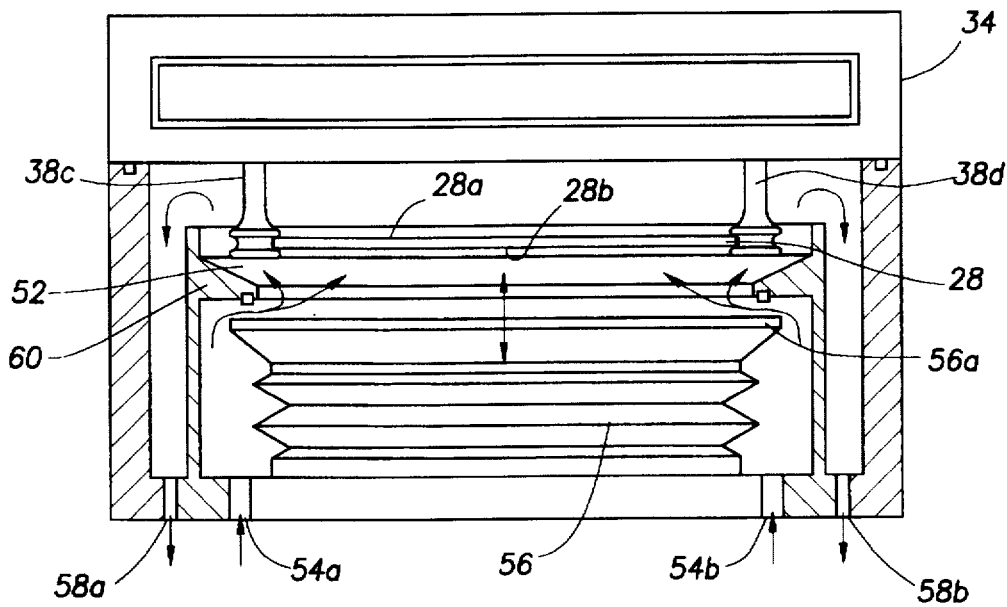
FIG. 5b is a cross-sectional view of a silicon wafer, held in the wafer clamp device, being subjected to a flow of reactant gases across the exposed surface of one side of the silicon wafer in a wafer processing station.

FIG. 5b is a cross-sectional view of a wafer processing station 36 capable of performing wafer fabrication operations on an exposed surface of side 28b of silicon wafer 28. This particular wafer fabrication operation involves a flow of reactant gases. Such wafer fabrication operations include thermal layer growth (e.g., silicon dioxide and silicon nitride) and layer deposition (e.g., chemical vapor deposition of silicon dioxide and silicon nitride). Patterning operations which may be conducted within processing chamber 52 include wet vapor etching and dry plasma etching operations.

During operation of wafer processing station 36, a flow of reactant gases is passed across the exposed surface of side 28b of silicon wafer 28. Reactant gases enter through inlet ports 54a and 54b. Flow control valve 56 may be positioned to allow reactant gases to flow past a valve face 56a of flow control valve 56 and into processing chamber 52 as shown in FIG. 5b. Reactant gases flow across the exposed surface of side 28b of silicon wafer 28 and are exhausted through exhaust ports 58a and 58b. As reactant gases do not flow across an exposed surface of side 28a of silicon wafer 28 during processing, processing does not occur on the exposed surface of side 28a of silicon wafer 28. Flow control valve 56 may be positioned such that valve face 56a contacts valve seat 60, stopping the flow of reactant gases into processing chamber 52.

Thermal growth operations require a source of heat within processing chamber 52. A radiant heat source may be incorporated into valve face 56a of valve 56 such that rapid thermal processing (RTP) is made possible. Subjected to radiant heat from the radiant heat source, the exposed surface of side 28b of silicon wafer 28 may be brought to an elevated processing temperature in seconds. With such extremely short processing times, the body of silicon wafer 28 may not reach the processing temperature. RTP is a technique typically used for annealing operations, thus a wafer processing station including a radiant heat source may also perform heat treatments of an exposed surface of a single side of a silicon wafer.

When RTP is used for thermal growth of a silicon dioxide (oxide) layer on the exposed surface of one side of a silicon wafer, the process is called RTO. RTO is typically used to grow gate oxides for metal oxide semiconductor (MOS) devices. Thus a wafer processing station adapted for RTP may also be used to thermally grow a layer of oxide or silicon nitride on the exposed surface of side 28b of silicon wafer 28 using wet or dry oxidation techniques. Wafer processing stations capable of forming a layer on the exposed surfaces of both sides of a silicon wafer independently by evaporation (of metals) and sputtering (of metals and oxide) are also conceivable.

Plasma-enhanced chemical vapor deposition and plasma etching operations require a source of radio frequency (RF) energy coupled to a pair of electrodes in processing chamber 52 such that a plasma is generated across the exposed surface of side 28b of silicon wafer 28. Such a source of RF energy and a pair of electrodes may be incorporated into processing station 36 of FIG. 5b.

The basic wafer processing operation of doping does not lend itself to implementation in small wafer processing stations. Standard doping methods include thermal diffusion and ion implantation. Doping by thermal diffusion is typically carried out in a diffusion furnace over time, and many silicon wafers are normally processed simultaneously. Doping by ion implantation is performed by physically large and complex systems. Thus doping operations for dual-sided silicon wafers are carried out using conventional methods and equipment. Thermal diffusion doping of an exposed surface of a single side of a silicon wafer may be accomplished by covering the exposed surface of the opposed side with a protective coating (e.g., photoresist). Doping by ion implantation is typically performed on the exposed surface of one side of a silicon wafer at a time.

In addition, photolithographic exposure of a layer of photoresist applied to an exposed surface of a side of a silicon wafer is also best suited for conventional methods and equipment. As described above, mechanical hand 16 is able to rotate a silicon wafer held between moveable fingers. Thus mechanical hand 16 may be used to apply a layer of photoresist to an exposed surface of one side of the silicon wafer using a common spin-coat technique. The softbake and hardbake operations may be carried out in a wafer processing station including a radiant heat source. Developing (i.e., removal of unpolymerized photoresist) may be accomplished in a wafer processing station adapted for wet spray etching (i.e., to apply a liquid to the exposed surface of one side of a silicon wafer using a spray technique). Removal of the photoresist layer may be accomplished using a wet or dry process carried out in a wafer processing station.

Using wafer processing stations, a wafer handling method is needed in order to change the side of a silicon wafer being processed. One method of gaining access to the opposite side of the wafer for processing, illustrated in FIGS. 6–7, involves mechanical hand 16 and a wafer holding unit 62 which allows access to both sides of silicon wafer 28. The steps of the method include (i) grasping silicon wafer 28 with moveable fingers 14a–d of mechanical hand 16, (ii) placing silicon wafer 28 into wafer holding unit 62 while noting the side of silicon wafer 28 mechanical hand 16 is proximal to (FIG. 6), (iii) positioning mechanical hand 16 proximal to the side of silicon wafer 28 opposite the side noted during the placing step and grasping silicon wafer 28 with moveable fingers 14a–d (FIG. 7), and (iv) removing silicon wafer 28 from wafer holding unit 62.

Conventional wafer processing methods and equipment may be combined with suitable wafer transfer systems and wafer processing stations to form a system capable forming active devices upon and within the exposed surfaces of both sides of a silicon wafer. The four basic wafer fabrication operations of layering, patterning, doping, and heat treatments may thus be performed on the exposed surfaces of both sides of a silicon wafer. Wafer processing stations may be used to perform layering, patterning, or heat treatment operations on the exposed surface of one side of a silicon substrate at a time. Photolithographic exposure steps of patterning operations require the use of conventional methods and equipment, as do doping operations. Many conventional processing techniques allow processing of the exposed surfaces of both sides of a silicon wafer simultaneously (e.g., heat treatment using a conventional furnace, doping by thermal diffusion in a conventional diffusion furnace, thermal oxidation in a conventional furnace, etc.). Processing steps required for the fabrication of active devices on the exposed surfaces of both sides of a silicon wafer may be coordinated in order to take advantage of this capability. In this case, conventional methods and equipment allowing processing of the exposed surfaces of both sides of a silicon wafer simultaneously may be advantageously employed.

Figure 8:
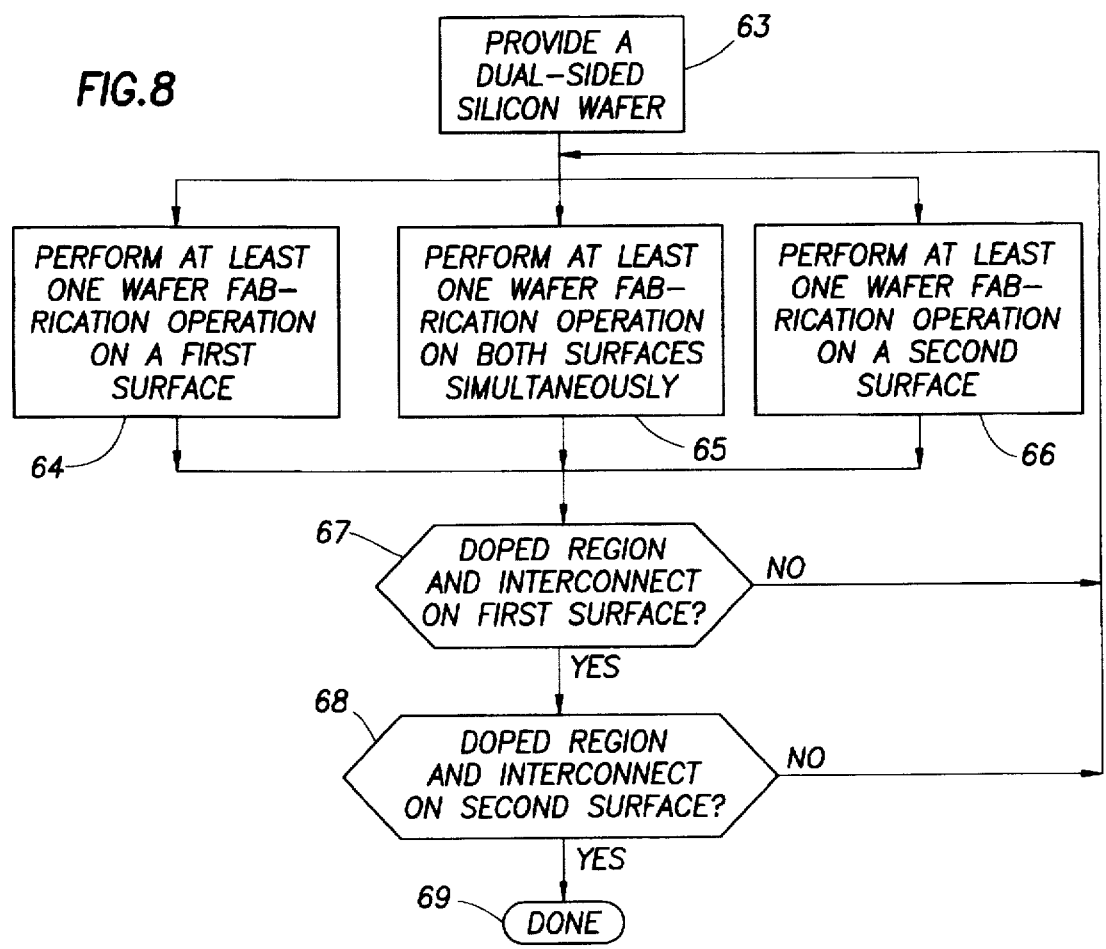
FIG. 8 is a flow chart of a method for forming active devices upon and within the exposed surfaces of both sides of a silicon wafer.
Figure 6:
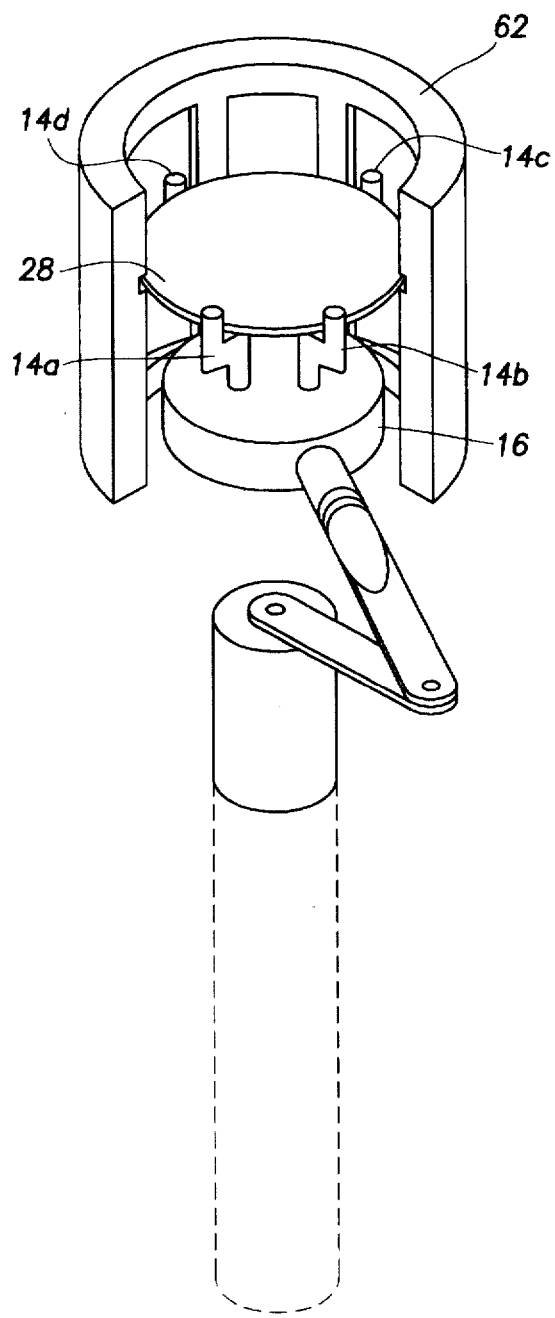
FIG. 6 is an isometric view of the mechanical arm placing a silicon wafer into a wafer holding unit.
Figure 7:
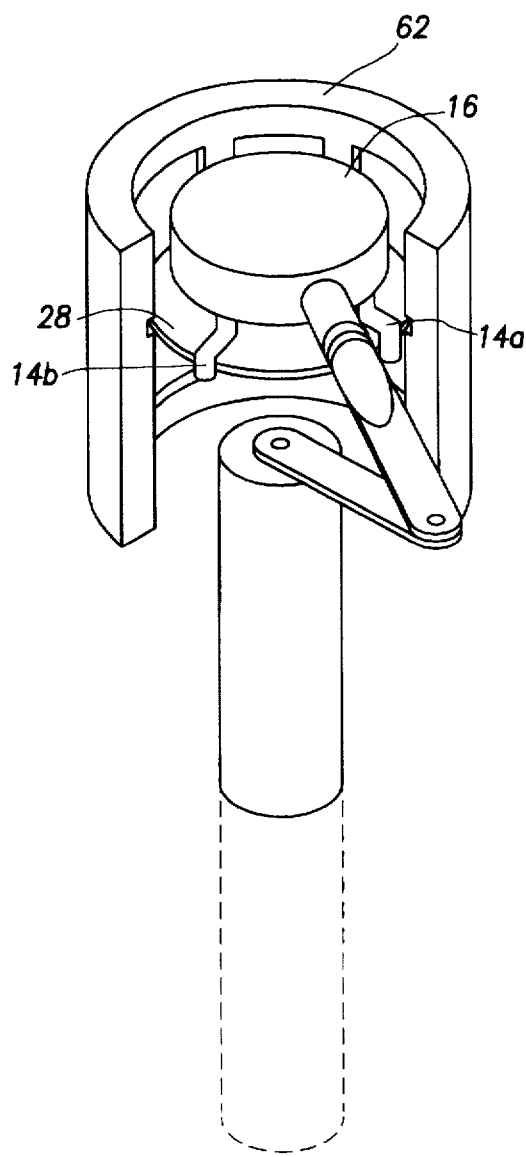
FIG. 7 is an isometric view of the mechanical arm removing the same silicon wafer placed into the wafer holding unit in FIG. 6.

FIG. 8 is a flow chart of a general method for forming integrated circuits upon and within the exposed surfaces of both sides of a silicon wafer. First step 63 is to provide a dual-sided silicon wafer. A dual-sided silicon wafer has a first surface and an opposed second surface prepared similarly to achieve surfaces suitable for fabricating semiconductor devices. After completion of step 63, any one of steps 64, 65, or 66 may be chosen.

Step 64 involves performing at least one wafer fabrication operation on the first surface of the dual-sided silicon wafer. Thus any number of wafer fabrication operations may be performed on the first surface of the silicon wafer during step 64. Step 65 involves performing at least one wafer fabrication operation on both surfaces of the silicon wafer simultaneously. Again, any number of wafer fabrication operations may be performed on both the first and second surfaces of the silicon wafer at the same time during step 65. Step 66 involves performing at least one wafer fabrication operation on the second surface of the dual-sided silicon wafer. As before, any number of wafer fabrication operations may be performed on the second surface of the silicon wafer during step 66.

Following completion of step 64, 65, or 66, a decision step 67 is reached. If a doped region and a patterned interconnect line electrically coupled thereto have not been formed on the first surface of the dual-sided silicon wafer, one of steps 64, 65, and 66 must be repeated. If a doped region and a patterned interconnect line electrically coupled thereto have been formed on the first surface, a second decision step 68 is encountered. If, upon reaching decision step 68, a doped region and a patterned interconnect line electrically coupled thereto have not been formed on the second surface of the dual-sided silicon wafer, one of steps 64; 65, and 66 must be repeated. If a doped region and a patterned interconnect line electrically coupled thereto have been formed on the second surface, the method is complete (step 69).

The above processing method advantageously includes the capability to perform wafer fabrication operations on both sides of a dual-sided silicon wafer separately or simultaneously. The processing method is complete when a doped region and a patterned interconnect line electrically coupled thereto (i.e., minimal integrated circuits) are formed upon and within both the first and second surfaces of the dual-sided silicon wafer.

It will be appreciated to those skilled in the art having the benefit of this disclosure that this invention is believed to be a method for forming integrated circuits upon and within the exposed surfaces of both sides of a silicon wafer. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for processing a silicon wafer, comprising the steps of:

providing a dual-sided silicon wafer having a first surface and an opposed second surface;

depositing a first protective layer upon the second surface, wherein the first protective layer is deposited at a temperature below that required for dopant ion migration within the silicon wafer, and wherein the first protective layer protects the second surface from damage during handling of the silicon wafer;

processing the first surface to produce:
 a first doped region within the first surface; and
 a patterned first interconnect line upon the first surface, wherein a portion of the first interconnect line is spaced from the first surface by a first electrically insulating layer, and wherein the first interconnect line is electrically coupled to the first doped region;

removing the first protective layer from the second surface;

depositing a second protective layer upon the first surface, wherein the second protective layer is deposited at a temperature below that required for dopant ion migration within the silicon wafer, and wherein the second protective layer protects the first surface from damage during handling of the silicon wafer; and processing the second surface to produce:
 a second doped region within the second surface; and
 a patterned second interconnect line upon the second surface, wherein a portion of the second interconnect line is spaced from the second surface by a second electrically insulating layer, and wherein the second interconnect line is electrically coupled to the second doped region;

wherein an active device is formed within at least one surface of the silicon wafer.

2. The method as recited in claim 1, wherein the first and second surfaces of the dual-sided silicon wafer are prepared similarly to achieve surfaces suitable for fabricating semiconductor devices.

3. The method as recited in claim 1, wherein a wafer processing operation is selected from the group consisting of layering, patterning, doping, and heat treatment.

4. The method as recited in claim 1, wherein the first and second doped regions comprise dopant atoms placed upon and within the dual-sided silicon wafer.

5. The method as recited in claim 1, wherein an integrated circuit is formed on said dual-sided silicon wafer.

6. The method as recited in claim 1, wherein the first and second protective layers comprise silicon dioxide.

7. The method as recited in claim 1, wherein the first and second protective layers comprise a low temperature oxide.

8. The method as recited in claim 7, wherein the low temperature oxide is formed by placing the silicon wafer in a reaction chamber containing silane ($SiH_4$) and oxygen ($O_2$), and increasing the temperature within the reaction chamber.

9. The method as recited in claim 1, wherein the first and second protective layers comprise a cured spin-on glass layer.

10. The method as recited in claim 1, wherein the first and second protective layers comprise silicon nitride.

11. A method for processing a silicon wafer, comprising the steps of:

providing a dual-sided silicon wafer having a first surface and an opposed second surface;

depositing a first protective layer upon the first surface, wherein the first protective layer is deposited at a temperature below that required for dopant ion migration within the silicon wafer, and wherein the first protective layer protects the first surface from damage during handling of the silicon wafer;

implanting dopants into the second surface;

removing the first protective layer from the first surface;

depositing a second protective layer upon the second surface, wherein the second protective layer is deposited at a temperature below that required for dopant ion migration within the silicon wafer, and wherein the second protective layer protects the second surface from damage during handling of the silicon wafer;

implanting dopants into the first surface;

removing the second protective layer from the second surface;

reapplying the first protective layer upon the first surface; and patterning interconnect lines upon the second surface, wherein portions of the interconnect lines are spaced from the second surface by an electrically insulating layer, and wherein the interconnect lines are in electrical communication with the implanted dopants within the second surface;

wherein an active device is formed within at least one surface of the silicon wafer.

12. The method as recited in claim 11, further comprising:

removing the first protective layer from the first surface;

reapplying the second protective layer upon the second surface; and patterning interconnect lines upon the first surface in electrical communication with the implant dopants within the first surface.

13. The method as recited in claim 11, wherein said first protective layer is configured between the first surface and a mechanical arm.

14. The method as recited in claim 11, wherein said second protective layer is configured between the second surface and a mechanical arm.

15. The method as recited in claim 11, wherein said dopant within the second surface and said interconnect lines patterned in electrical communication thereto comprise at least a portion of an integrated circuit.

* * * * *